US012610857B2

(12) United States Patent
Fujiwara et al.

(10) Patent No.: US 12,610,857 B2
(45) Date of Patent: Apr. 21, 2026

(54) IN-MEMORY COMPUTING CIRCUIT AND FABRICATION METHOD THEREOF

(71) Applicant: Taiwan Semiconductor Manufacturing Company, Ltd., Hsinchu (TW)

(72) Inventors: Hidehiro Fujiwara, Hsin-Chu (TW); Haruki Mori, Hsinchu (TW); Wei-Chang Zhao, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 977 days.

(21) Appl. No.: 17/736,971

(22) Filed: May 4, 2022

(65) Prior Publication Data

US 2023/0361081 A1 Nov. 9, 2023

(51) Int. Cl.
| | |
|---|---|
| *H01L 25/065* | (2023.01) |
| *G06N 3/04* | (2023.01) |
| *H01L 23/00* | (2006.01) |
| *H01L 25/00* | (2006.01) |
| *H01L 25/10* | (2006.01) |
| *H01L 25/18* | (2023.01) |

(52) U.S. Cl.
CPC ........... *H01L 25/0657* (2013.01); *G06N 3/04* (2013.01); *H01L 24/16* (2013.01); *H01L 25/105* (2013.01); *H01L 25/18* (2013.01); *H01L 25/50* (2013.01); *H01L 2224/16145* (2013.01); *H01L 2224/16225* (2013.01); *H01L*

*2225/06517* (2013.01); *H01L 2225/06541* (2013.01); *H01L 2225/1058* (2013.01); *H01L 2924/1435* (2013.01)

(58) Field of Classification Search
CPC ... H01L 25/0657; H01L 24/16; H01L 25/105; H01L 25/18; H01L 2224/16145; H01L 2224/16225; H01L 2225/06517; H01L 2225/06541; H01L 2225/1058; H01L 2924/1435; H01L 25/0652
See application file for complete search history.

(56) References Cited

U.S. PATENT DOCUMENTS

| | | | | |
|---|---|---|---|---|
| 4,631,662 A | * | 12/1986 | Stutler | ...................... G06F 3/05 712/36 |
| 2012/0098145 A1 | * | 4/2012 | Yoshida | .................. H01L 24/97 257/777 |
| 2017/0286000 A1 | * | 10/2017 | Ito | ........................... G11C 29/48 |
| 2021/0193615 A1 | * | 6/2021 | Kwon | ..................... H01L 24/10 |

* cited by examiner

*Primary Examiner* — Thanh Y Tran
(74) *Attorney, Agent, or Firm* — JCIPRNET

(57) ABSTRACT

An in-memory computing circuit is provided. The in-memory computing circuit includes a core die, a plurality of conductive pillars, and a plurality of memory dies. The plurality of memory dies are coupled to the core die through the plurality of conductive pillars and are configured to implement computing operation. The plurality of memory dies includes at least one of the memory dies disposed on a bottommost memory die of the plurality of memory dies. The plurality of memory dies receives an input data from the core die through a common input terminal of the core die.

20 Claims, 6 Drawing Sheets

WL

1T1C cell

BL

RBL

12T CELL

WBL

IN-MEMORY COMPUTING CIRCUIT AND FABRICATION METHOD THEREOF

BACKGROUND

Most of the current artificial intelligence (AI) computing, which is originally inspired by the biological neural networks, is achieved through artificial neural networks (ANN) and operates through a mathematical model is built up by simulating biological or human neurons. The mathematical model can be replicated repeatedly to create a deep learning network that can be used to process many signals (such as digital images processing) much faster than human brain. However, building up high performance and fast analysis of AI applications requires a large amount of computation and memory space, and the hardware (or the integrated chips) is needed to accelerate the computation speed as well, leading the in-memory computing to become an overnight sensation.

Computing in memory (or in-memory computing) is a kind of AI-accelerated computation architecture and can be a type of analog computing, in which the computing process is to first compute the data directly in memory and then send the analysis results to the processor, thus improving the conventional von Neumann Architecture. The architecture is now widely used in ANN computing chips, convolutional neural networks (CNN) accelerators, deep neural networks (DNN) accelerators, AI processing chips, and the like to reduce computational power consumption. Compared with the conventional von Neumann architecture, which adopts digital logic processing, the analog memory computing architecture is the most popular AI computing architecture. It is understood that in-memory computing architectures have attracted a lot of research in recent years and are now widely used in neuron-type computing chips and AI processing chips, in which the memory can be designed by using static random-access memory (SRAM), dynamic random-access memory (DRAM), Flash, spin-transfer-torque magnetoresistive random-access memory (STT-MRAM), resistive random-access memory (ReRAM), conductive bridging random-access memory (CBRAM), phase change memory (PCM), ferroelectric random-access memory (Fe-RAM), etc.

Even though the processor is much faster than the memory read/write, the data processing speed is still limited by the memory transmission bandwidth, affecting the computation speed. In contrast, in-memory computing provides the ability to perform image or voice recognition on the terminal device with lower power consumption and higher efficiency. In the traditional computing architecture, the data needs to be read out from or written back into the memory by central processing unit (CPU) or field programmable gate array (FPGA) through the I/O interface, which is time-consuming. In this way, the computation (such as multiply-accumulate (MAC) operation) speed and the transmission bandwidth of a memory circuit with computing-in-memory circuitry is going to be limited. Therefore, multiple-die stack is a suitable way to implement large memory in the same footprint.

On the other hand, as the bulk of massive data generated from various network activities, the integrated circuit or semiconductor device used in semiconductor chips, needs faster computation ability for the next generation AI application such as the emerging fields of cognitive computing, internet of things (IoT), data centric applications, advanced driver assistance systems (ADAS), edge computing, medical technology, genetic research, robotics, 5G/6G communications, data mining, decision system, and cryptocurrency that could benefit from implementation on non-von Neumann computing architecture based on the computation-in-memory (or computing in memory) (CIM) dies. The CIM dies could implement digital memristive logic or perform certain arithmetic operations such as vector-matrix multiplication. However, due to the manner of chip-to-chip communication in different sorts of the multiple die stack structures, the power consumption, the timing penalty, and heat dissipation are destined to be the biggest bottlenecks that are remained to be settled.

Owing to the ever changing semiconductor applications in our lives, memory for high speed operation with stacked CIM dies plays a crucial role in emerging memory applications and has drawn considerable interest along with advances in computing architectures and semiconductor technologies. Recently, there are still rooms for further increasing computation capability of memory array in a given area and designing a more area-efficient memory driving circuit architecture for the next generation memory applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
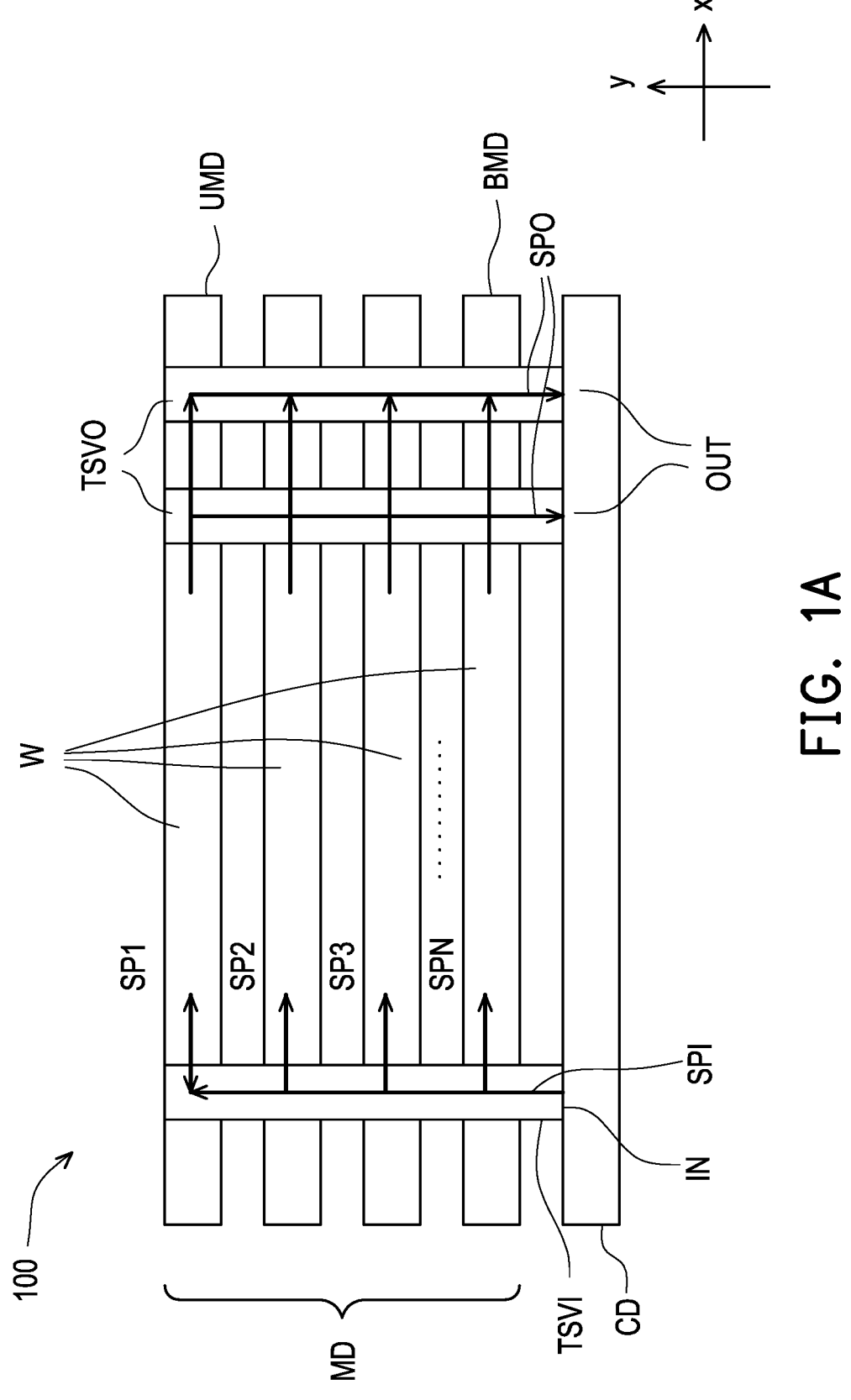
FIG. 1A is a schematic diagram of a portion of a computing-in-memory ("CIM") device in accordance with some embodiments.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third", "fourth" and the like, may be used herein for ease of description to describe similar or different element(s) or feature(s) as illustrated in the figures, and may be used interchangeably depending on the order of the presence or the contexts of the description.

This disclosure relates generally to the multi stacked computing-in-memory ("CIM") dies. Compute-in-memory or in-memory computing systems store information in the main random-access memory (RAM) of computers and perform calculations at memory cell level, rather than moving large quantities of data between the main RAM and data store for each computation step. Because stored data is accessed much more quickly when it is stored in RAM, compute-in-memory allows data to be analyzed in real time, enabling faster reporting and decision-making in business and machine learning applications. Efforts are ongoing to improve the performance of compute-in-memory systems.

An example of applications of CIM is multiply-accumulate ("MAC") operations, in which an input array of numbers are multiplied (weighted) by the respective elements in another array (e.g., column) of numbers (weights), and the products are added together (accumulated) to produce an output sum. This is mathematically similar to a dot product (or scalar product) of two vectors, in which procedure the components of two vectors are pair-wise multiplied with each other, and the products of the component pairs are summed. In certain artificial intelligence (AI) systems, such as artificial neural networks, an array of numbers can be weighted by multiple columns of weights. The weighting by each column produces a respective output sum. An output array of sums thus is produced from an input array of numbers by the weights in a matrix of multiple columns. Similar operations are employed in other applications, such as multi-bit convolutional neural network ("CNN") operations.

The everlasting demand for higher computing power for CNN or deep neural networks (DNNs) drives the development of parallel computing architectures. DNN model demands high computation ability and are inherently in a parallel manner. Lately, the prevalence of DNNs has given rise to specialized CIM. Nearly all DNN-based CIMS are matrix multiplication systems, since computation of DNNs follows the linear algebra motif, such as convolutions in CNNs or long short term memory (LSTM)/gated recurrent units (GRU) layers in Recurrent Neural Networks (RNNs).

The planar nature of modern CIM allows two dimensional (2D) parallelism. Implementing operations with higher dimensions such as convolutions with a batch size requires unrolling the operands in 2D matrices, mapped along the two spatial dimensions and in time dimension. The 2D mapping restricts the parallelism computation. Given with an infinitely large array, some operations must be executed sequentially. Therefore, extending the dimension to the third spatial dimension to enhance its parallelism ability is needed since the runtime can be reduced. Layers of 2D CIM arrays stacked in 3D and the connections between each of the CIMS (for MAC operations) enable the entire 3D structure to work as a single computing unit.

3D chip (die) integration, in which dies are integrated and connected vertically, can further enhance performance because it introduces another level of spatial parallelism. Monolithic and TSV-based stacked 3D-ICs are provided in present application compared against 2D-ICs or 2.5D-ICs.

However, due to the manner of chip-to-chip communication in different sorts of the multi stacked die structures, the power consumption, the timing penalty, and heat dissipation are destined to be the bottlenecks that are remained to be settled, resulting in inefficiency of the data communication between the stacked dies while in MAC operations.

FIG. 1A is a schematic diagram of a portion of a computing-in-memory ("CIM") device in accordance with some embodiments.

Referring to FIG. 1A, the in-memory computing circuit 100 includes a core die CD, a plurality of conductive pillars (TSVI and TSVO), and a plurality of memory dies MD. In accordance with some embodiments of the disclosure, the core die CD may be or include logic dies, such as central processing unit (CPU) dies, graphic processing unit (GPU) dies, micro control unit (MCU) dies, input-output (I-O) dies, base band (BB) dies, field-programmable gate array (FPGA), power management integrated circuit (PMIC) dies, transceiver (TRX) dies, application processor (AP) dies, radio frequency (RF) dies, sensor dies, micro-electro-mechanical-system (MEMS) dies, signal processing dies (e.g., digital signal processing (DSP) dies), front-end dies (e.g., analog front-end (AFE) dies), or the like. In some embodiments, the core die CD may be any semiconductor die. The disclosure is not limited by the number or type of dies used for the core die CD within a stacked in-memory computing circuit 100.

The plurality of memory dies MD is stacked layer-by-layer to form a 3D architecture and is coupled to the core die CD. In some embodiments, at least one of the memory dies MD is disposed on the bottommost memory die BMD of the plurality of memory dies MD. As illustrated in FIG. 1A, the plurality of memory dies MD receives input data from the core die CD through a common input terminal IN of the core die CD. In addition, the core die CD further includes a plurality of output terminals OUT and receives multiple output data from the plurality of memory dies MD.

In accordance with some embodiments of the disclosure, the multiple memory dies MD are vertically spaced apart with each other in a predetermined distance along a second direction (along the y-axis). As illustrated in FIG. 1A, the core die CD are vertically spaced apart with the multiple memory dies MD in a predetermined distance along the second direction (along the y-axis).

In this disclosure, the plurality of memory dies MD is configured to implement computing operation in a parallel manner (e.g., in an assembly line manner). In some embodiments, the computing operation included multiply-accumulate (MAC) operation or a dot product operation, but is not limited thereto. In some embodiments, the MAC operation is implemented by virtue of the input data transmitted from the core die CD and the weighting values W stored in the plurality of memory dies MD. In some embodiments, each memory die MD stores single weighting value W, wherein the weighting values W are loaded to the memory die through a plurality of vias disposed on a substrate from an external memory device (e.g., DRAM) adjacent to the core die CD. Specifically, the memory dies MD receives the input data from the core die CD along a input signal path SPI through the same input conductive pillar TSVI, then the input data is transmitted to the signal paths (SP1, SP2, SP3, . . . , SPN) from the input signal path SPI at the same cycle. After the input data entering into the memory dies MD, each memory dies MD executes the MAC operation simultaneously and then generates the computed output data. Further, the output data are transmitted along the output signal paths SPO to the output terminals OUT of the core die CD. In some embodiments, the core die CD receives the multiple output data at the end of the plurality of output terminals OUT from the plurality of memory dies MD at the same cycle. In some embodiments, the core die CD receives the multiple output data at the end of the plurality of output terminals OUT from the plurality of memory dies MD at different cycles. In some embodiments, each computation time period in each memory die MD may be the same. In some embodiments, different parts of a partial product at each memory die MD are being assembled at the same time.

In accordance with some embodiments of the disclosure, the memory dies MD may be or include memory array. Each memory cell in the memory array may include an access transistor and a storage capacitor. The access transistor is a field effect transistor (FET). A terminal of the storage capacitor is coupled to a source/drain terminal of the access transistor, while the other terminal of the storage capacitor may be coupled to a reference voltage (e.g., a ground voltage). When the access transistor is turned on, the storage capacitor can be accessed. On the other hand, when the access transistor is in an off state, the storage capacitor is inaccessible.

In accordance with some embodiments of the present disclosure, a memory array includes a plurality of the memory cells.

In some embodiments of the present disclosure, the memory array has rows and columns. The memory cells in each row may be arranged along a direction X, while the memory cells in each column may be arranged along a direction Y intersected with the direction X. A plurality of the bit lines BL may be respectively coupled to a row of the memory cells, and may extend along the direction X. On the other hand, a plurality of the word lines WL may be respectively coupled to a column of the memory cells, and may extend along the direction Y. The in-memory computing circuit 100 may include more of the memory arrays, and these memory arrays may be spaced apart from one another.

In some embodiments, during a write operation, the access transistor is turned on by asserting a word line WL coupled to a gate terminal of the access transistor, and a voltage applied on a bit line BL coupled to a source/drain terminal of the access transistor may be transferred to the storage capacitor coupled the other source/drain terminal of the access transistor. Accordingly, the storage capacitor may be charged or discharged (i.e., programmed by a voltage provided to a bit line coupled to the selected memory cell), and a logic state "1" or a logic state "0" can be stored in the storage capacitor.

During a read operation, the access transistor is turned on as well, and the bit line BL being pre-charged may be pulled up or pulled down according to a charge state of the storage capacitor. In specific, a word line WL coupled to the selected memory cell is asserted, then the pre-charged bit lines BL are further pulled up or pulled down by the storage capacitors of the memory cells coupled to the asserted word line WL, respectively. By comparing the voltage variation of the bit line BL to the selected memory cell with a reference voltage, the charge state of the storage capacitor can be sensed, and the logic state of the memory cell can be identified. By virtue of pulling up/down the pre-charged bit lines BL, the charges stored in the storage capacitors of the memory cells coupled to the asserted word line WL are altered. In order to restore logic states of these memory cells, the read operation may be followed by a write operation for programming the previous logic states to these memory cells, and such write operation may also be referred as a refresh operation.

The memory arrays are routed to the memory control circuit or memory controller lying under the memory arrays. Although not shown, the word lines WL of the memory array may be routed to the underlying memory controller as well. As will be further described with reference to FIG. 1A, the memory controller is formed on a surface of a semiconductor substrate (e.g., core die), while the memory arrays are embedded in a stack of interlayer dielectric layers lying over the memory controller.

In accordance with some embodiments of the disclosure, the memory dies MD may be or include CIM dies that can be implemented with a variety of memory devices, including charge based memory such as static random-access memory ("SRAM"), dynamic random-access memory (DRAM), Flash and resistance based memory such as resistive random-access memory (ReRAM), phase change memory (PCM), conductive bridging random-access memory (CBRAM), ferroelectric random-access memory (FeRAM), and spin-transfer-torque magnetoresistive random-access memory (STT-MRAM), or high bandwidth memory (HBM) etc. In a typical SRAM device, for example, data are written to, and read from, an SRAM cell via one or more bitlines ("BLs") upon activation of one or more access transistors in the SRAM cell by enable-signals from one or more word-lines ("WLs"). The SRAM based CIM design turns on multiple WLs in a column of SRAM cells to discharge a common BL, such as a read-BL ("RBL") to implement a 1-bit MAC.

In accordance with some embodiments of the disclosure, the in-memory computing circuit 100 further includes a first (or input) conductive pillar TSVI and at least one second (or output) conductive pillar TSVO. The first conductive pillar TSVI and the output conductive pillar TSVO vertically penetrates through at least one of the plurality of memory dies MD. As illustrated in FIG. 1A, the first conductive pillar TSVI also connects the upmost memory die UMD and the bottommost memory die BMD to the input terminal IN of the core die CD. Likewise, the output conductive pillar TSVO connects the upmost memory die UMD and the bottommost memory die BMD to the output terminal OUT of the core die CD. In some embodiments, the output conductive pillar TSVO includes at least one pillar. In some embodiments, the output conductive pillars TSVO are laterally spaced apart with each other in a predetermined distance along a first direction (along the x-axis) and transmit multiple output data to the output terminal OUT of the core die CD along a second direction (along the y-axis).

In accordance with some embodiments of the disclosure, the multiple memory dies MD are coupled to at least one multiplier, at least one adder, at least one register, and at least one accumulator.

In accordance with some embodiments of the disclosure, the core die CD is coupled to at least one memory controller (or memory control circuit) (not shown). Therefore, the core die CD is able to receive the control signal from at least one memory controller and then the memory controller is able to control the core die CD through the control signal for accessing to the multiple memory dies MD in a predetermined period cycle. Thus the core die CD is able to manage the communication of the input data and the output data simultaneously in a predetermined period through the first pillar TSVI and the output data through the output pillar TSVO.

According to different design needs, the memory control circuit and/or a block of the memory controller may be implemented in the form of hardware, firmware, software (i.e., a program), or a combination of the majority of the foregoing three.

In the form of hardware, the memory control circuit and/or the block of the memory controller may be implemented in the form of a logic circuit on an integrated circuit. Related functions of the memory control circuit and/or the memory controller may be implemented as hardware through using hardware description languages (e.g., Verilog HDL or VHDL) or other suitable programming languages. For instance, the related functions of the memory control circuit and/or the memory controller may be implemented in one or a plurality of controllers, a micro controller, a micro-processor, an application-specific integrated circuit (ASIC), a digital signal processor (DSP), a field programmable gate array (FPGA), and/or various logic blocks, modules, and circuits in other processing units.

In the form of software and/or firmware, the related functions of the memory control circuit and/or the memory controller may be implemented as programming codes. For instance, the memory control circuit and/or the memory controller may be implemented by using a general programming language (e.g., C, C++, or an assembly language) or other suitable programming languages. The programming code may be recorded/stored in a recording medium. In some embodiments, the recording medium includes, for example, read only memory (ROM), random access memory (RAM), and/or a storage device. The storage device includes a hard disk drive (HDD) a solid-state drive (SSD), or other storage devices. In some other embodiments, the recording medium may include a "non-transitory computer readable medium". For instance, a tape, a disk, a card, semiconductor memory, a programmable logic circuit, etc. may be used to be implemented as the non-transitory computer readable medium. A computer, a central processing unit (CPU), a controller, a micro controller, or a micro-processor may read and execute the programming code from the recording medium to accomplish the related functions of the memory control circuit and/or the memory controller. Further, the programming code may also be provided to the computer (or CPU) through any transmission medium (a communication network or a broadcast wave, etc.). The communication network includes, for example, Internet, a wired communication network, a wireless communication network, or other communication media.

The memory controller includes sense amplifiers. The sense amplifiers are configured to facilitate read operations. Each sense amplifier may include two inputs. One of the inputs is coupled to a bit line BL from the memory array, while the other input is coupled to a bit line BL from the memory array. During a read operation, both bit lines BL coupled to the inputs of a sense amplifier SA are pre-charged to a pre-charging voltage, and one of these bit lines BL would be further pulled up or pulled down by the storage capacitor in a selected memory cell, while the other bit line BL still holds at the pre-charging voltage. The sense amplifier is configured to output the logic state of the selected memory cell by comparing the voltage on the bit line BL coupled to the selected memory cell with the pre-charging voltage held by the other bit line BL. For instance, when a memory cell in the memory array is selected for a read operation, the bit lines BL from the memory arrays are pre-charged to a pre-charging voltage. Further, the word line WL coupled to the selected memory cell is asserted, and the bit line BL coupled to the selected memory cell is further pulled up or pulled down by the storage capacitor in the selected memory cell. The bit line BL being further pulled up/down is coupled to an input of one of the sense amplifiers, and another input of this sense amplifier is coupled to a bit line BL from the memory array. During such read operation, none of the word lines WL in the memory array is asserted, thus the bit line BL from the memory array is prevented from being further pulled up/down, thus still holds at the pre-charging voltage. This sense amplifier compares the voltage at the bit line BL coupled to the selected memory cell with the pre-charging voltage held by the bit line BL, and identify the logic state of the selected memory cell.

According to some embodiments of the present disclosure, the in-memory computing circuit 100 includes a front-end-of-line (FEOL) structure (not shown) formed on a semiconductor substrate. The semiconductor substrate may be a semiconductor wafer (e.g., a silicon wafer) or a semiconductor-on-insulator (SOI) wafer (e.g., a silicon-on-insulator wafer). The FEOL structure may include active devices as logic components in the memory controller. These active devices may include transistors, such as metal-oxide-semiconductor field effect transistors (MOSFETs). The transistors may respectively include a gate structure and a pair of source/drain structures at opposite sides of the gate structure. As an example, the transistors may be planar type MOSFETs, and each gate structure is formed on a planar portion of the semiconductor substrate. In addition, the source/drain structures may be doped regions formed in the semiconductor substrate or epitaxial structures formed in recesses at a surface of the semiconductor substrate. Alternatively, the transistors may be fin type MOSFETs or gate-all-around (GAA) MOSFETs, and three-dimensional channel structures (e.g., fin structures, nanosheets, forksheet, CFET or the like) may be formed on the semiconductor substrate. The gate structures may cover and intersect with these three-dimensional channel structures, and the source/drain structures may be in lateral contact with the three-dimensional channel structures. Further, the FEOL structure may also include a dielectric layer and contact plugs formed in the dielectric layer. The dielectric layer covers the semiconductor substrate and the transistors, and the contact plugs extend from a top surface of the dielectric layer to the gate structures and the source/drain structures of the transistors, in order to establish electrical contact with the transistors.

A back-end-of-line (BEOL) structure of the in-memory computing circuit 100 is formed on the FEOL structure. The BEOL structure may include a stack of interlayer dielectric layers. The memory arrays described with reference to FIG. 1A are embedded in the stack of interlayer dielectric layers (not shown). Routing elements (e.g., conductive pillars, conductive pillars, or metal lines) may spread in the stack of interlayer dielectric layers. A portion of the routing elements may be configured to interconnect the transistors formed in the underlying FEOL structure, and may be formed in bottommost ones of the interlayer dielectric layers. The transistors as well as the contact plugs and the routing elements for interconnecting the transistors may form at least a portion of the memory controller as described with reference to FIG. 1A (not shown). In addition, as will be further described with reference to FIG. 1A, another portion of the routing elements may be configured to connect the bit lines BL and word lines WL in the memory arrays to the memory controller formed in the FEOL structure and a bottom portion of the BEOL structure. In some embodiments, the routing elements include conductive lines, conductive pillars, and conductive pillars. The conductive lines may each laterally extend in one of the interlayer dielectric layers. Although not shown, the conductive pillars may each vertically penetrate through one or more of the interlayer dielectric layers, to establish electrical contact with one or more of the conductive lines.

Figure 1B:
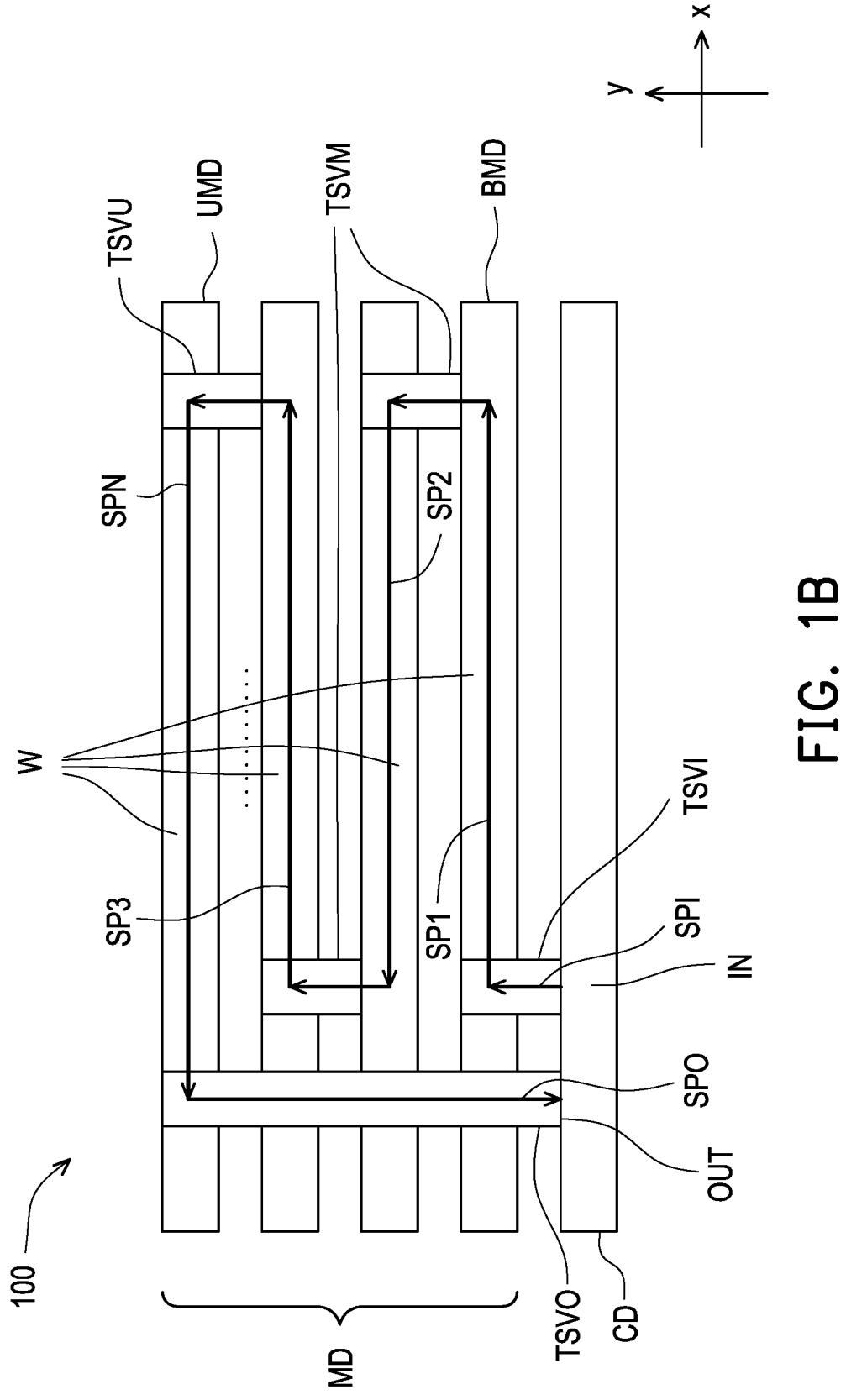
FIG. 1B is another schematic diagram of a portion of a CIM device in accordance with some embodiments.

FIG. 1B is another schematic diagram of a portion of a computing-in-memory ("CIM") device in accordance with some embodiments.

Referring to FIG. 1B, the in-memory computing circuit 100 included a core die CD, multiple conductive pillars (TSVI, TSVB, TSVM, and TSVU), and multiple memory dies MD. By analogy, the dies that the core die CD and the memory dies MD includes may also be represented in a manner similar to the context represented in FIG. 1A. Therefore, the same details will not be repeated in the following. The multiple memory dies MD are served as the CIM die and are responsible for the computing operation.

The plurality of memory dies MD is stacked layer-by-layer to form a 3D architecture and is coupled to the core die CD through an output conductive pillar TSVO. In some embodiments, at least one of the memory dies MD is disposed on the bottommost memory die BMD of the plurality of memory dies MD. As illustrated in FIG. 1B, the bottommost memory die BMD of the memory dies MD receives input data from the core die CD through an input terminal IN of the core die CD. In addition, the core die CD further includes an output terminal OUT and receives an output data from the upmost memory die UMD of the plurality of memory dies MD. On the other hand, the core die CD includes an input terminal IN and transmits an input data to the bottommost memory die BMD.

In accordance with some embodiments of the disclosure, the multiple memory dies MD are vertically spaced apart with each other in a predetermined distance along a second direction (along the y-axis). As illustrated in FIG. 1B, the core die CD are vertically spaced apart with the multiple memory dies MD in a predetermined distance along the second direction (along the y-axis) as well.

In accordance with some embodiments of the disclosure, the in-memory computing circuit 100 may include a first conductive pillar (e.g., the output conductive pillar TSVO), a second conductive pillar (e.g., the input conductive pillar TSVI), a third conductive pillar (e.g., the middle conductive pillar TSVM), and a fourth conductive pillar (e.g., the upmost conductive pillar TSVU). As illustrated in FIG. 1B, the output conductive pillar TSVO vertically penetrates through at least one of the plurality of memory dies MD and connects to the output terminal OUT of the core die CD and the upmost memory die UMD of the multiple memory dies MD. The input conductive pillar TSVI vertically penetrates through at least one of the multiple memory dies MD and connects to the top side of the core die CD and the bottommost memory die BMD of the multiple memory dies MD. The middle conductive pillar TSVM vertically penetrates through at least one of the memory dies MD and connects to the bottom side of the upmost memory die UMD of the multiple memory dies MD. In addition, one of the memory dies MD disposed between the upmost memory die UMD and the bottommost memory die BMD of the plurality of memory dies. The upmost conductive pillar TSVU vertically penetrates through at least one of the plurality of memory dies MD and is disposed between the upmost memory die UMD and the bottommost memory die BMD of the multiple memory dies MD. The output conductive pillar TSVO receives the output data from the upmost memory die UMD of the plurality of memory dies MD and transmit the output data to the output terminal OUT of the core die CD. The input conductive pillar TSVI receives the input data from the input terminal IN of the core die CD.

In this disclosure, the multiple memory dies MD is served as implement computing operation in a pipeline manner. In some embodiments, the MAC operation is implemented by virtue of the input data that is transmitted from the core die CD and the multiple weighting values W temporarily stored in the plurality of memory dies MD. In some embodiments, each memory die MD receives multiple weighting values W. In specific, the bottommost memory die BMD receives the input data from the core die CD along a input signal path SPI through the input conductive pillar TSVI, then the input data passes through the signal path SP1 to the signal path SP2, the signal path SP2 to the signal path SP3, the signal path SP3 to the signal path SPN, and finally output the computation results along the output signal path SPO through the output conductive pillar TSVO at different computing cycle.

In other words, the computation result generated in each memory die may be served as an outcome of one single layer of the neural networks. In some embodiments, after the input layer (which may be the bottommost memory die BMD) completed the MAC operation and generated a computed value of the first layer, the computed value of the first layer will be fed forward to the subsequent layer (which may be one of the memory die MD between the bottommost memory die BMD and upmost memory die UMD) through the middle conductive pillar TSVM. Upon receiving the computed value and/or result, the subsequent layer executes another MAC operation and generates another computed value of the subsequent layer. After repeated computations in the feed-forward or forward propagation manner, the computed result generated by the memory dies MD between the bottommost memory die BMD and upmost memory die UMD will finally be transmitted to the output layer (which may be the upmost memory die UMD) through the output conductive pillar TSVU. Therefore, the output data or output result of the output layer may be passed to the output terminal OUT of the core die CD through the output conductive pillar TSVO. That is, the complete multi-layer neural networks computation is finished after multiple cycles compared to the embodiment which the parallel computation is finished in a cycle referred to the FIG. 1A. In some embodiments, each MAC operation executed in single layer (memory die MD) is completed in corresponding computation cycle. In some embodiments, the computation cycle in each memory die MD may be different from each other.

With pipelining MAC operation, the in-memory computing circuit 100 allows the next input data to be fetched while the memory die MD is performing arithmetic operations, holding them in a buffer, which may be the multiple conductive pillars TSVI, TSVM, TSVU, TSVO, close to the memory dies MD or core die CD until each MAC operation can be performed. The staging of input data fetching is continuous. The result is an increase in the number of input data that can be performed during a given time period. The overall process of pipelining computation in memory dies MD can take advantage of the computation operations that can proceed concurrently in the stacked 3D memory dies architecture.

In some embodiments, the output data is sequentially generated by virtue of the MAC operations. In some embodiments, the computation may starts from the bottommost memory die BMD to the upmost memory die UMD. In some embodiments, the core die CD receives the output data at the end of the output terminal OUT from the upmost memory die UMD of the memory dies MD through the output conductive pillar TSVO. In some embodiments, the core die CD receives the output data at the end of the output terminal OUT from one of the memory dies MD through one of the middle conductive pillars TSVM.

In accordance with some embodiments of the disclosure, output conductive pillar TSVO, the input conductive pillar TSVI, the middle conductive pillar TSVM, and the output conductive pillar TSVU are laterally spaced apart along the first direction (along the x-axis). In some embodiments, the input conductive pillar TSVI, the middle conductive pillar TSVM, and the output conductive pillar TSVU are vertically spaced apart from one another with a spacing in between along the second direction (along the y-axis).

In accordance with some embodiments of the disclosure, the in-memory computing circuit 100 may execute the MAC operation collaboratively in the parallel and in the pipeline manner at the same time period by making use of the mixed-stacking 3D memory dies architecture through suitable arrangement of the multiple conductive pillars TSVO, TSVI, TSVU, and TSVM.

In accordance with some embodiments of the disclosure, the method of manufacturing memory integrated circuit includes forming a core die CD. The core die has an input terminal IN for transmitting an input data sequentially and continuously and has a plurality of output terminals OUT for receiving a plurality of output data. Further, disposing multiple memory dies MD which are coupled to the core die CD through an input conductive pillar TSVI and output conductive pillars TSVO. Each memory dies MD receives the weighting values W respectively, and the memory dies MD are able to execute the parallel computing operation. The plurality of memory dies MD includes at least one of the plurality of memory dies MD disposed on a bottommost memory die BMD of the plurality of memory dies MD and the plurality of memory dies receives an input data from the core die CD through a common input terminal IN of the core die CD and transmit a plurality of output data through a plurality of output terminals OUT of the core die CD.

Figure 2:
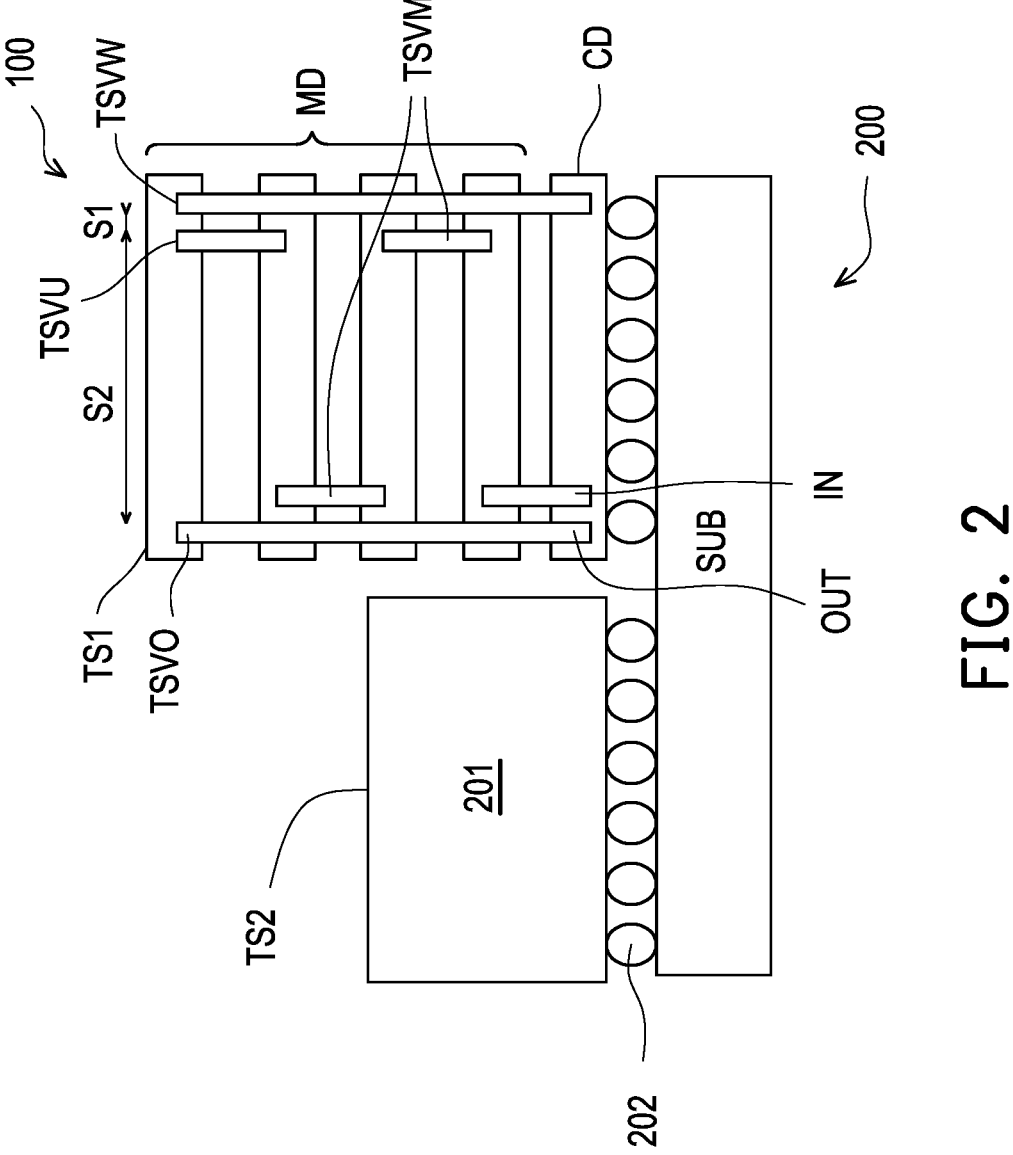
FIG. 2 is a schematic diagram of a CIM device with a random access memory (RAM).
Figure 2:
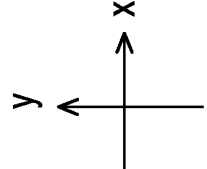

FIG. 2 is a schematic diagram of a CIM chip 200 including CIM device 100 and a random access memory (RAM) 201.

Referring to FIG. 2, the in-memory computing circuit 100 further includes a weighted conductive pillar TSVW. As illustrated in FIG. 2, the weighted conductive pillar TSVW vertically penetrates through at least one of the plurality of memory dies MD, electrically connects the plurality of memory dies MD and the core die CD, and is disposed close to the upmost conductive pillar TSVU. Each of the stacking memory dies MD may extend along a direction Y. The stacking memory dies MD may be vertically spaced apart from each other along a direction Y intersected with the direction X. Further, the conductive pillar (e.g., the middle conductive pillar TSVM and the upmost conductive pillar TSVU) disposed on adjacent stacking memory dies MD may be laterally spaced apart from each other along the direction X and as well vertically spaced apart from each other along a direction Y. In yet other embodiments, the weighted conductive pillar TSVW and the output conductive pillars TSVO are at least laterally spaced apart by the upmost conductive pillar TSVU.

In some embodiments, the weighted conductive pillar TSVW and other conductive pillars (e.g., the output conductive pillars TSVO, the upmost conductive pillar TSVU, and the middle conductive pillar TSVM) disposed in the plurality of memory dies MD are formed of a conductive material. For instance, the conductive material may include tungsten, titanium nitride, ruthenium, tantalum nitride, molybdenum, tungsten nitride, the like or combinations thereof. Further, although the conductive pillars and the weighted conductive pillar TSVW are depicted as rectangular pillars, the conductive pillars and the weighted conductive pillar TSVW may alternatively be formed as other shapes (e.g., circular pillars), the present disclosure is not limited thereto.

In accordance with some embodiments of the disclosure, the weighted conductive pillar TSVW is configured to receive the weighting value from the RAM 201 (i.e., the weighted data is loaded from the RAM 201) disposed on a substrate SUB and to transmit the weighting value to the plurality of memory dies MD. The core die CD of the CIM device 100 is configured to control the CIM operation on the plurality of memory dies MD. That is, the core die CD is coupled to at least one memory controller (not shown) and receives at least one control signal from at least one memory controller. In some embodiments, the RAM 201 may be DRAM, SRAM, eDRAM, the present disclosure is not limited thereto.

In some embodiments, the CIM device 100 and the RAM 201 adjacent to the CIM device 100 are disposed on the same substrate SUB of the CIM chip 200. In alternative embodiments, the CIM device 100 and the RAM 201 of the CIM chip 200 may be disposed on the different substrate, the present disclosure is not limited thereto. In other embodiments, the CIM device 100 and the RAM 201 are electrically connected through an interconnection structure 202. For example, the interconnection structure 202 may be conductive vias which is formed of the conductive materials. Further, the conductive materials may also be formed by the afore-mentioned conductive material.

In some embodiments, the first spacing 51 between the weighted conductive pillar TSVW and the upmost conductive pillar TSVU is smaller than a second spacing S2 between the output conductive pillars TSVO and the upmost conductive pillar TSVU.

In other embodiments, a first top surface TS1 of an upmost memory die of the plurality of memory dies is higher than a second top surface TS2 of the external RAM 201. In alternative embodiments, the first top surface TS1 of an upmost memory die of the plurality of memory dies may equal to a second top surface TS2 of the external RAM 201.

Figure 3:
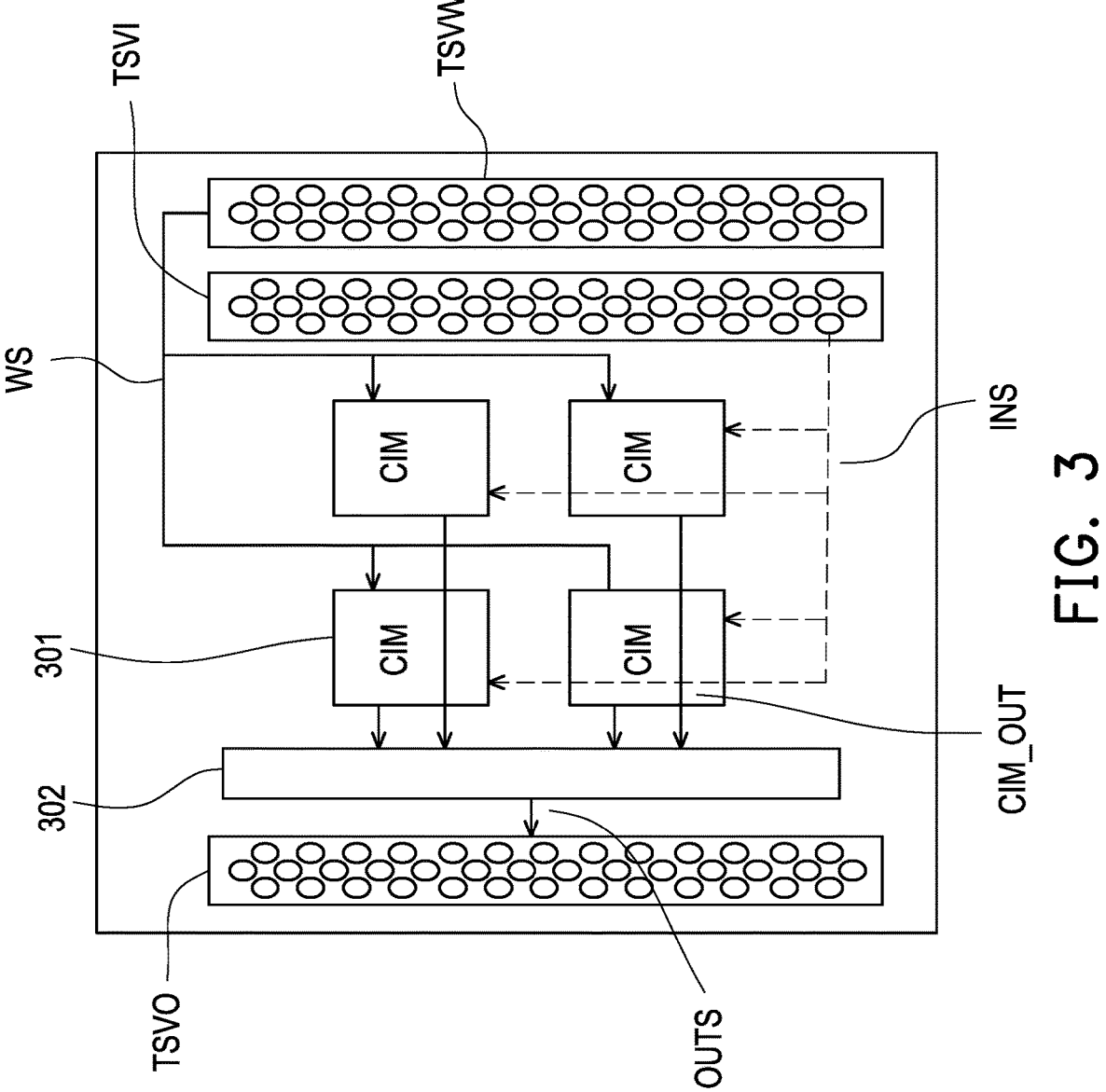
FIG. 3 is a top view schematic diagram of the memory die according to some embodiments of the present disclosure.

FIG. 3 is a top view schematic diagram of each memory die MD according to some embodiments of the present disclosure.

Referring to FIG. 2 and FIG. 3, the memory die MD further includes a CIM circuit 301 and a computing layer 302. The CIM circuit 301 is configured to execute the in-memory computing. Specifically, the CIM circuit 301 receives the weighting signal WS which carries the information of the weighting value from the weighted conductive pillar TSVW. On the other hand, the CIM circuit 301 receives the input signal INS, which contains the information of the input data, from the input conductive pillar TSVI as well. It will be appreciated by those skilled in the art that the original input data comes from the input terminal of the core die CD. In this regard, by virtue of receiving the weighting signal WS and the input signal INS, the CIM circuit 301 is able to implement the MAC operation and to transmit the output results CIM_OUT to the computing layer 302. In some embodiments, the weighting signal WS is transmitted to the stacking memory dies MD at the same cycle (or the same period of time). Alternatively, the weighting signal WS is transmitted to the stacking memory dies MD at different cycle.

In some embodiments, the computing layer 302 is configured to receive the output results CIM_OUT of the in-memory computing from the CIM circuit 301. In other embodiments, the computing layer 302 is, for instance, responsible for transforming the summed weighted input (e.g., the output results CIM_OUT) from the connecting node into the activation of the node. In accordance with some embodiments of the disclosure, the computing layer 302 takes the rectified linear unit (ReLU) as an activation device for executing data processing of the plurality of output data received from the plurality of CIM circuits by an activation function. The ReLU function, which is a piecewise linear function that will output the input directly if it is positive, otherwise, it will output zero. In some embodiments, ReLU is the default activation function for many types of neural networks because a learning model with ReLU is easier to train and achieves better performance. In yet other embodiments, the default activation function may be sigmoid function, tan h function, ELU function, Leaky ReLU function, Maxout function, etc.

In accordance with some embodiments of the disclosure, the computing layer 302 is used to serve as a pooling layer which is applied after a convolution layer (not shown) to reduce the spatial size of the input. In some embodiments, the computing layer 302 is able to implement Max (or Min) pooling. In this type of pooling, the maximum (or minimum) value of each kernel in each depth slice is captured and passed on to the next layer. In other embodiments, the computing layer 302 is able to implement L2 pooling. In this type of pooling, the L2 or the Frobenius norm is applied to each kernel. Accordingly, the computing layer 302 may reduce the number of training parameters and computation cost, thus control over-fitting and make model invariant to certain distortion.

In some embodiments, the computing layer 302 repeatedly outputs a computing data OUTS to the next layer of the memory die MD through one of the middle conductive pillar TSVM. In accordance with some embodiments of the disclosure, the computing layer 302 outputs a computing data OUTS to the output conductive pillar TSVO and the computing (or output) data is transmitted to the output terminal OUT of the output conductive pillar TSVO. Therefore, the core die CD is able to receive the output data in a pipeline manner by virtue of the layer-by-layer computing of the memory dies MD.

Figure 4A:
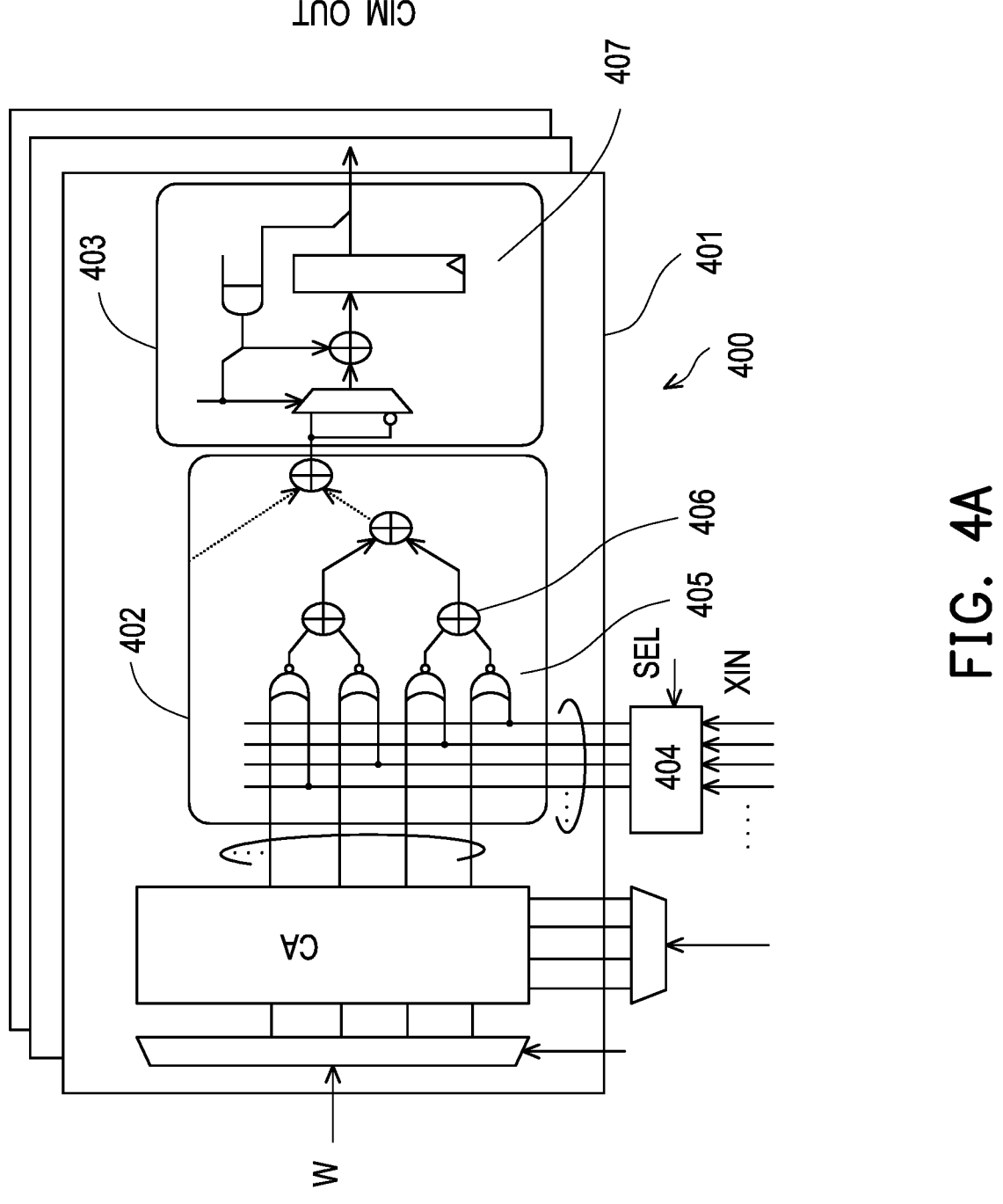
FIG. 4A is a schematic diagram of a CIM circuit according to some embodiments of the present disclosure.
Figure 4B:
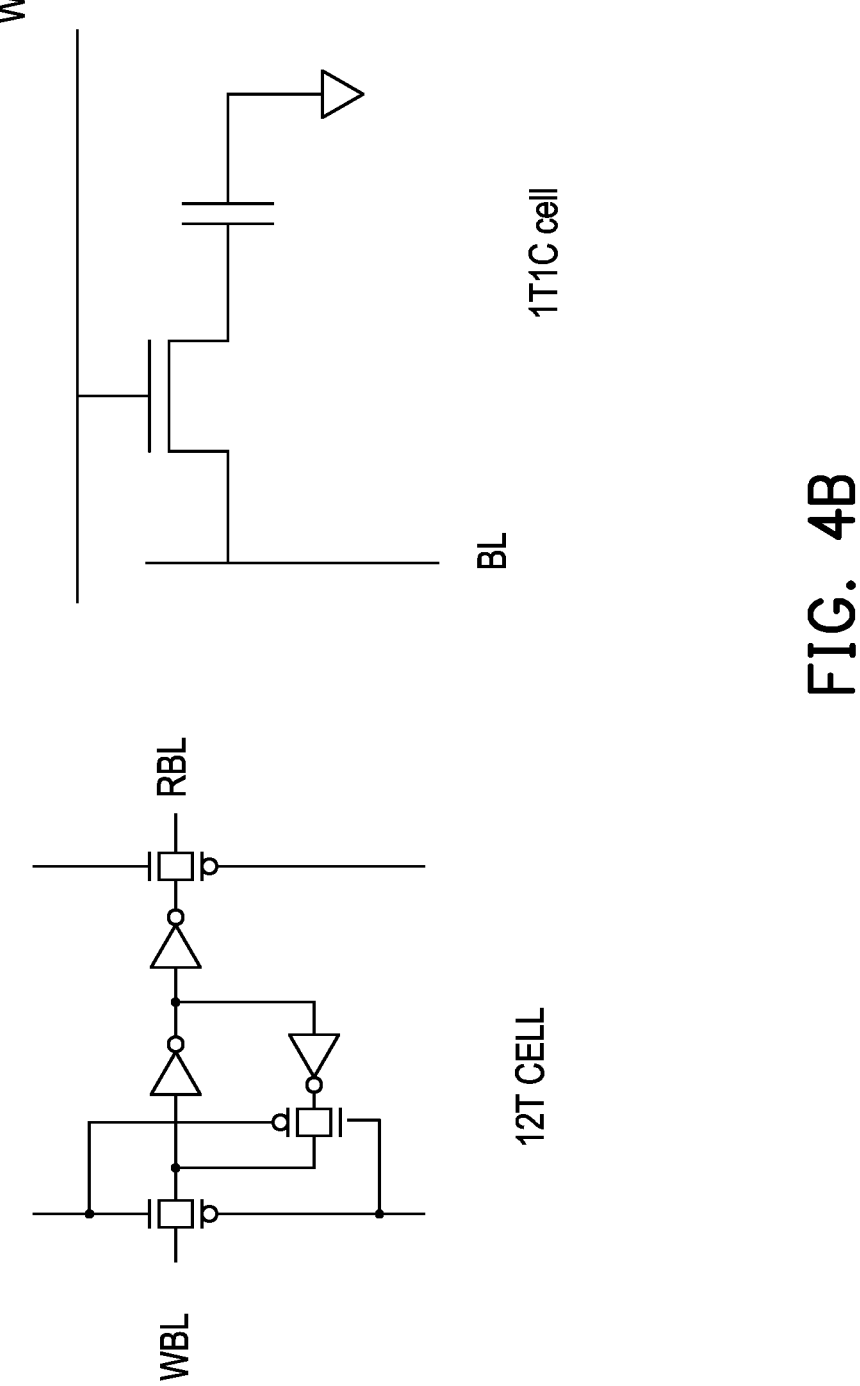
FIG. 4B is a schematic diagram illustrating the RAM circuit according to some embodiments of the present disclosure.

FIG. 4A is a schematic diagram of a CIM circuit 400 according to some embodiments of the present disclosure. FIG. 4B is a schematic diagram illustrating the RAM circuit according to some embodiments of the present disclosure.

Referring to FIG. 4A and FIG. 4B, the overall architecture of the CIM circuit 400 at least includes MAC array 401 and a driver 404. Each MAC array 401 at least comprises a cell array CA, a first block 402, and a second block 403.

Referring to FIGS. 3, 4A and 4B, in some embodiments, the cell array CA includes MAC arrays with 12T cells for signed or unsigned weight storage. In some embodiments, the cell array CA includes MAC arrays with 1T1C cells. In other embodiments, the cell array CA are separated into a plurality of banks (e.g., 64 banks), and each bank includes a plurality of rows and columns. In some embodiments, the cell array CA receives the input data from the input conductive pillar TSVI and multiple weighting values W from the weighted conductive pillar TSVW. The driver 404 is configured to receive a signed or unsigned input XIN and a selection signal SEL, and output a driving signal to the first block 402.

In some embodiments, a bitwise multiplier 405 (e.g., NOR gate) of the first block 402 receives input information from the cell array CA through the read bit line (RBL) and the driving signal from the driver 404. The adder tree 406 of the first block 402 accumulates the output result from each NOR gate 405 as a partial sum result and transmit the partial sum result to a bit-shifter of the second block 403. The bit-shifter of the second block 403 compensates for the bit significance of the input XIN and the final MAC output result CIM_OUT can be obtained from the final accumulator 407 of the second block 403 through a plurality of flip-flops (FFs). In some embodiments, the bit-shifter and the accumulator 407 of the second block 403 may optionally use a 2's compliment of the partial sum result to handle signed input calculation.

In other embodiments, the CIM circuit 400 also supports read operations such as read out data from the cell array CA through the adder tree 406 of the first block 402.

Referring to FIGS. 4A and 4B, the 12T cell with write bit line (WBL) and RBL, which is built in the cell array CA, is responsible for the read and write operation. In other embodiments, the 1T1C cell with word line (WL) and bit line (BL) is also responsible for read and write operation. The operation detail can be easily known by referring to the embodiments mentioned above, and no more repeated description here.

In these embodiments, the CIM circuit 400 and the pipeline manner by virtue of the layer-by-layer computing of the memory dies MD not only realizes the simultaneous MAC and write operations but provides wide range dynamic voltage-frequency scaling due to the functionality of the 12T cell and low-voltage operation. Further, the circuit architecture and layout topology can be optimized as well.

In some embodiments, an in-memory computing circuit, comprising: a core die; a first conductive pillar; a plurality of memory dies for performing a computing operation, wherein each of the memory dies coupled to the core die through the first conductive pillar and the second conductive pillars, and the core die transmits input data to the memory dies through the first conductive pillar parallel, and the core die receives output data from the memory dies through the second conductive pillars. In some embodiments, each of the plurality of memory dies stores weighting values transmitted from the core die, wherein the weighting value is loaded from an external memory device. In some embodiments, each of the plurality of memory dies receives the input data and implements a multiply-accumulate (MAC) operation according to the input data and the weighting values stored in each of the plurality of memory dies. In some embodiments, the first conductive pillar vertically penetrates through at least one of the plurality of memory dies and connects to the input terminal of the core die, wherein a second conductive pillar vertically penetrates through at least one of the plurality of memory dies and connects to the plurality of output terminals of the core die, and wherein the first conductive pillar receives the input data from the input terminal of the core die. In some embodiments, each of the memory dies comprises at least one multiplier, at least one adder, and at least one accumulator. In some embodiments, the core die is configured to manage a communication of the input data through the first pillar and the output data through the second pillar. In some embodiments, the plurality of memory dies are vertically spaced apart with each other in a predetermined distance along a second direction and wherein the core die are vertically spaced apart with the plurality of memory dies in a predetermined distance along a second direction.

In some embodiments, an in-memory computing circuit, comprising: a core die; a first conductive pillar; a plurality of second conductive pillars; and a plurality of memory dies for performing a computing operation, wherein any two adjacent dies of the core die and the memory dies are coupled by one of the second conductive pillars and the core die is commonly coupled to the memory dies through the first conductive pillar, wherein the core die transmits input data to each of the memory dies through the second conductive pillars in sequence, and receives output data from the memory dies through the first conductive pillar. In some embodiments, the plurality of memory dies is configured to implement computing operation in a pipeline manner. In some embodiments, each of the plurality of memory dies stores a weighting value transmitted from the core die, wherein the weighting values are loaded from an external memory device. In some embodiments, each of the memory dies performs one of a plurality of layers for a convolution neural network, and the output data is generated by a last stage memory die of the memory dies by performing a multiply-accumulate (MAC) operations. In some embodiments, the in-memory computing circuit further comprises: the first conductive pillar, vertically penetrating through at least one of the plurality of memory dies, connecting to the output terminal of the core die and the upmost memory die of the plurality of memory dies; a second conductive pillar, vertically penetrating through at least one of the plurality of memory dies, connecting to the top side of the core die and the bottommost memory die of the plurality of memory dies; a third conductive pillar, vertically penetrating through at least one of the plurality of memory dies, connecting to the bottom side of the upmost memory die of the plurality of memory dies and one of the memory dies of the plurality of memory dies disposed between the upmost memory die and the bottommost memory die of the plurality of memory dies; and a fourth conductive pillar, vertically penetrating through at least one of the plurality of memory dies, disposed between the upmost memory die and the bottommost memory die of the plurality of memory dies, wherein the first conductive pillar receives the output data from the upmost memory die of the plurality of memory dies and transmit the output data to the output terminal of the core die, and wherein the second conductive pillar receives the input data from the input terminal of the core die. In some embodiments, the first conductive pillar, the second conductive pillar, the third conductive pillar, and the fourth conductive pillar are laterally spaced apart along a first direction, and wherein the second conductive pillar, the third conductive pillar, and the fourth conductive pillar are vertically spaced apart from one another along a second direction. In some embodiments, the in-memory computing circuit further comprises a weighted pillar configured to receive the weighting values transmitted from an external memory device and transmit the weighting values to the plurality of memory dies. In some embodiments, the weighted pillar and the first conductive pillar are at least laterally spaced apart by the third conductive pillar. In some embodiments, each of the memory dies further comprises: a plurality of CIM circuits, receiving the weighting values from the weighted pillar and an input data from the plurality of second conductive pillars; an activation device, receiving a plurality of output data from the plurality of CIM circuits for executing data processing of the plurality of output data by an activation function and transmitting an output result to the first conductive pillar. In some embodiments, each of the memory dies is configured to execute one-layer neural network computing and output a computing data to a corresponding memory die in sequence. In some embodiments, a first spacing between the weighted pillar and the third conductive pillar is smaller than a second spacing between the first pillar and the third conductive pillar. In some embodiments, a top surface of an upmost memory die is higher than a top surface of the external memory device.

In some embodiments, a method of manufacturing in-memory computing circuit, comprising: forming a core die having an input terminal to transmit an input data and having a plurality of output terminals to receive a plurality of output data; and disposing a plurality of memory dies coupling to the core die through a first conductive pillar and a second conductive pillar, wherein the plurality of memory dies stores the weighting values respectively and is configured to implement parallel computing operation, wherein the plurality of memory dies include at least one of the plurality of memory dies disposed on a bottommost memory die of the plurality of memory dies and wherein the plurality of memory dies receive an input data from the core die through a common input terminal of the core die and transmit a plurality of output data through a plurality of output terminals of the core die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An in-memory computing circuit, comprising:
   a core die;
   a first conductive pillar;
   a plurality of second conductive pillars;
   a plurality of memory dies for performing a computing operation,
   wherein each of the memory dies coupled to the core die through the first conductive pillar and the second conductive pillars, and the core die transmits input data to at least one of the memory dies through the first conductive pillar in parallel, and the core die receives output data from the memory dies through the second conductive pillars,
   wherein the core die receives the output data of at least two of the memory dies from at least two of the second conductive pillar and transmits the input data to at least one of the memory dies simultaneously.

2. The in-memory computing circuit according to claim 1, wherein each of the plurality of memory dies stores weighting values transmitted from the core die, wherein the weighting values are loaded from an external memory device.

3. The in-memory computing circuit according to claim 2, wherein each of the plurality of memory dies receives the input data and implements a multiply-accumulate (MAC) operation according to the input data and the weighting values stored in each of the plurality of memory dies.

4. The in-memory computing circuit according to claim 1, wherein the first conductive pillar vertically penetrates through at least one of the plurality of memory dies and connects to the input terminal of the core die, wherein a second conductive pillar vertically penetrates through at least one of the plurality of memory dies and connects to the plurality of output terminals of the core die, and wherein the first conductive pillar receives the input data from the input terminal of the core die.

5. The in-memory computing circuit according to claim 1, wherein each of the memory dies comprises at least one multiplier, at least one adder, and at least one accumulator.

6. The in-memory computing circuit according to claim 1, wherein the core die is configured to manage a communication of the input data through the first conductive pillar and the output data through the second conductive pillars.

7. The in-memory computing circuit according to claim 1, wherein the plurality of memory dies are vertically spaced apart with each other in a first predetermined distance along a second direction and wherein the core die are vertically spaced apart with the plurality of memory dies in a second predetermined distance along the second direction.

8. An in-memory computing circuit, comprising:
a core die;
a first conductive pillar;
a plurality of second conductive pillars; and
a plurality of memory dies for performing a computing operation,
wherein the core die and the adjacent memory die and any two adjacent dies of the memory dies are coupled by one of the second conductive pillars and the core die is commonly coupled to the memory dies through the first conductive pillar,
wherein two of the second conductive pillars in two adjacent memory dies spaced by a distance and form a signal path in a horizontal direction, and the core die transmits input data to each of the memory dies through two of the second conductive pillars through the signal path in sequence die by die, and receives output data from the memory dies through the first conductive pillar.

9. The in-memory computing circuit according to claim 8, wherein the plurality of memory dies is configured to implement computing operation in a pipeline manner.

10. The in-memory computing circuit according to claim 8, wherein each of the plurality of memory dies stores a weighting value transmitted from the core die, wherein the weighting value is loaded from an external memory device.

11. The in-memory computing circuit according to claim 8, wherein each of the memory dies performs one of a plurality of layers for a convolution neural network, and the output data is generated by a last stage memory die of the memory dies by performing a multiply-accumulate (MAC) operations.

12. The in-memory computing circuit according to claim 8, wherein the in-memory computing circuit further comprises:
the first conductive pillar, vertically penetrating through all of the plurality of memory dies, connecting to the output terminal of the core die and an upmost memory die of the plurality of memory dies;
wherein the second conductive pillars comprise:
an input conductive pillar, vertically penetrating through a bottommost memory die of the plurality of memory dies, connecting to a top side of the core die and the bottommost memory die of the plurality of memory dies;
at least one middle conductive pillar, vertically penetrating through at least one of the plurality of memory dies, connecting to a bottom side of the upmost memory die of the plurality of memory dies and at least one middle memory die of the plurality of memory dies disposed between the upmost memory die and the bottommost memory die of the plurality of memory dies; and
a upmost conductive pillar, vertically penetrating through the upmost memory die, disposed between the upmost memory die and the at least one middle memory die memory die of the plurality of memory dies,
wherein the first conductive pillar receives the output data from the upmost memory die of the plurality of memory dies and transmit the output data to the output terminal of the core die, and
wherein the input conductive pillar receives the input data from the input terminal of the core die, and the input data is transmitted from the bottommost memory die to the topmost memory die through the at least one middle conductive pillar and the upmost conductive pillar die by die.

13. The in-memory computing circuit according to claim 12, wherein the first conductive pillar, the input conductive pillar, the at least one middle conductive pillar, and the upmost conductive pillar are laterally spaced apart along a first direction, and wherein the conductive pillar, the at least one middle conductive pillar, and the upmost conductive pillar are vertically spaced apart from one another along a second direction.

14. The in-memory computing circuit according to claim 12, wherein the in-memory computing circuit further comprises a weighted pillar configured to receive the weighting values transmitted from an external memory device and transmit the weighting values to the plurality of memory dies.

15. The in-memory computing circuit according to claim 14, wherein the weighted pillar and the first conductive pillar are at least laterally spaced apart by the third conductive pillar.

16. The in-memory computing circuit according to claim 14, wherein each of the memory dies further comprises:
a plurality of CIM circuits, receiving the weighting values from the weighted pillar and an input data from the plurality of second conductive pillars;
an activation device, receiving a plurality of output data from the plurality of CIM circuits for executing data processing of the plurality of output data by an activation function and transmitting an output result to the first conductive pillar.

17. The in-memory computing circuit according to claim 14, wherein each of the memory dies is configured to execute one-layer neural network computing and output a computing data to a corresponding memory die in sequence.

18. The in-memory computing circuit according to claim 15, wherein a first spacing between the weighted pillar and the third conductive pillar is smaller than a second spacing between the first conductive pillar and the third conductive pillar.

19. The in-memory computing circuit according to claim 15, wherein a top surface of an upmost memory die is higher than a top surface of the external memory device.

20. An in-memory computing circuit, comprising:
a plurality of layers of neural network, wherein the layers are respectively disposed in a plurality of memory dies and the memory dies are stacked by each other;
a core die;
a first conductive pillar;
a plurality of second conductive pillars;

wherein each of the memory dies coupled to the core die through the first conductive pillar and the second conductive pillars, and the core die transmits input data of weighting values to at least one of the memory dies through the first conductive pillar in parallel, and the core die receives output data from the memory dies through the second conductive pillars, wherein the core die receives the output data of at least two of the memory dies from at least two of the second conductive pillar and transmits the input data to at least one of the memory dies simultaneously.

\* \* \* \* \*